United States Patent
Zakharian et al.

(10) Patent No.: US 7,172,977 B1
(45) Date of Patent: Feb. 6, 2007

(54) METHOD FOR NON-DESTRUCTIVE REMOVAL OF CURED EPOXY FROM WAFER BACKSIDE

(75) Inventors: David Zakharian, Santa Clara, CA (US); Kevin Weaver, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 87 days.

(21) Appl. No.: 10/989,753

(22) Filed: Nov. 15, 2004

(51) Int. Cl.
*H01L 21/302* (2006.01)

(52) U.S. Cl. .................. 438/745; 438/750; 134/1.1

(58) Field of Classification Search ........... 438/745, 438/750, 751, 460, 464; 134/1.1, 1.2
See application file for complete search history.

(56) References Cited

U.S. PATENT DOCUMENTS

| | | | |
|---|---|---|---|
| 5,512,613 A * | 4/1996 | Afzali-Ardakani et al. . | 523/443 |
| 5,654,590 A * | 8/1997 | Kuramochi ................ | 257/778 |
| 6,023,094 A | 2/2000 | Kaeo et al. | |
| 6,352,881 B1 | 3/2002 | Nguyen et al. | |
| 6,900,110 B1 * | 5/2005 | Takiar et al. ............. | 438/421 |
| 2004/0217389 A1 * | 11/2004 | Hall et al. ................ | 257/222 |
| 2005/0090076 A1 * | 4/2005 | Barsky et al. ............ | 438/464 |

OTHER PUBLICATIONS

U.S. Appl. No. 10/830,820, entitled "Semiconductor Devices Having a Back Surface Protective Coating" filed Apr. 23, 2004.
U.S. Appl. No. 10/080,913, entitled "Method and Apparatus for Forming an Underfill Adhesive Layer" filed Feb. 21, 2002.
U.S. Appl. No. 10/224,291, entitled "Method and Apparatus for Forming an Underfill Adhesive Layer" filed Aug. 19, 2002.
U.S. Appl. No. 10/707,208, entitled "Integrated Circuit Device Package Having a Support Coating for Improved Reliability During Temperature Cycling " filed Aug. 19, 2002.

* cited by examiner

*Primary Examiner*—Lan Vinh
(74) *Attorney, Agent, or Firm*—Beyer Weaver & Thomas LLP

(57) ABSTRACT

Disclosed is a method for non-destructive removal of cured epoxy from a wafer backside. A wafer back-coated with epoxy is soaked in an acetone bath for a period of time, allowing degradation of the epoxy coating adhesion strength. The epoxy coating is then peeled or scraped away, leaving the wafer backside ready for a rework or for a reapplication of a new epoxy coating.

14 Claims, 6 Drawing Sheets

US 7,172,977 B1

METHOD FOR NON-DESTRUCTIVE REMOVAL OF CURED EPOXY FROM WAFER BACKSIDE

BACKGROUND OF THE INVENTION

The present invention relates generally to semiconductor wafers and, more particularly, to a method for non-destructive removal of cured epoxy from the backside of a semiconductor wafer.

A semiconductor wafer may undergo a coating process wherein the backside of the wafer is coated with epoxy. The coating may serve as a barrier to light or as a protective coating. It is possible for the coating process to result in an unsatisfactory coating, for example due to particular airflow patterns or curing temperatures in a curing oven, resulting in not fully cured or unevenly cured epoxy. In such a case, it is desirable to remove the epoxy coating without damaging the wafer in order to save and recoat the wafer.

Prior to full or partial curing of the epoxy coating, the epoxy is still soft and can be wiped off, leaving the wafer backside ready for a reapplication of the coating. However, once the epoxy coating is partially or fully cured, it hardens and can no longer be wiped off. Traditional methods of removing cured epoxy from the wafer backside include grinding off the hardened epoxy from the wafer backside. Aside from being messy, removal by grinding generally stresses the wafer and removes some of the wafer backside surface along with the hardened epoxy, reducing the wafer thickness and resulting in a more fragile wafer. Additionally, the hardened epoxy coating may be uneven to begin with, causing the grinding process to damage the wafer backside surface when an attempt is made to grind off the uneven remains of hardened epoxy.

Accordingly, a need exists for a method for non-destructive removal of cured epoxy from the backside of a semiconductor wafer.

SUMMARY OF THE INVENTION

To achieve the foregoing and other objects and according to the purpose of the present invention, a method for non-destructive removal of cured epoxy from a wafer backside is disclosed. In one embodiment, a back-coated wafer is soaked in an acetone bath for a period of time, allowing degradation of the epoxy coating adhesion strength. The epoxy coating is then peeled or scraped away, leaving the wafer backside ready for a rework or for a reapplication of a new epoxy coating.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Methods for non-destructive removal of cured epoxy from the backside of a semiconductor wafer are described below. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
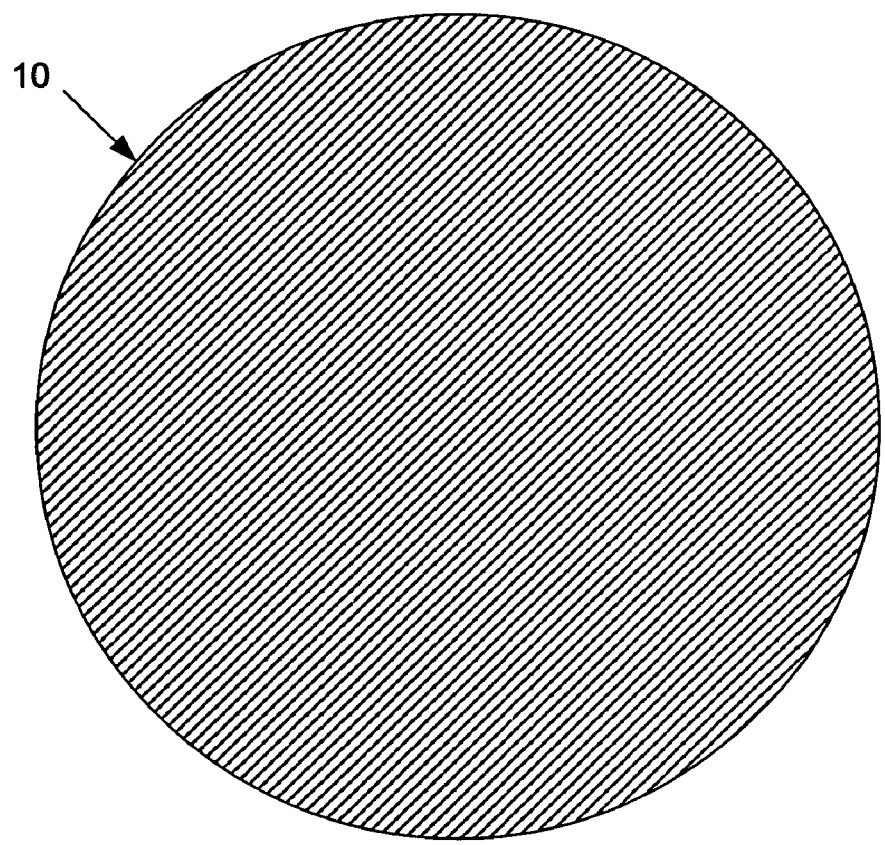
FIG. 1 is a diagrammatic top view of a back-coated wafer, in accordance with an embodiment of the present invention.
Figure 2:
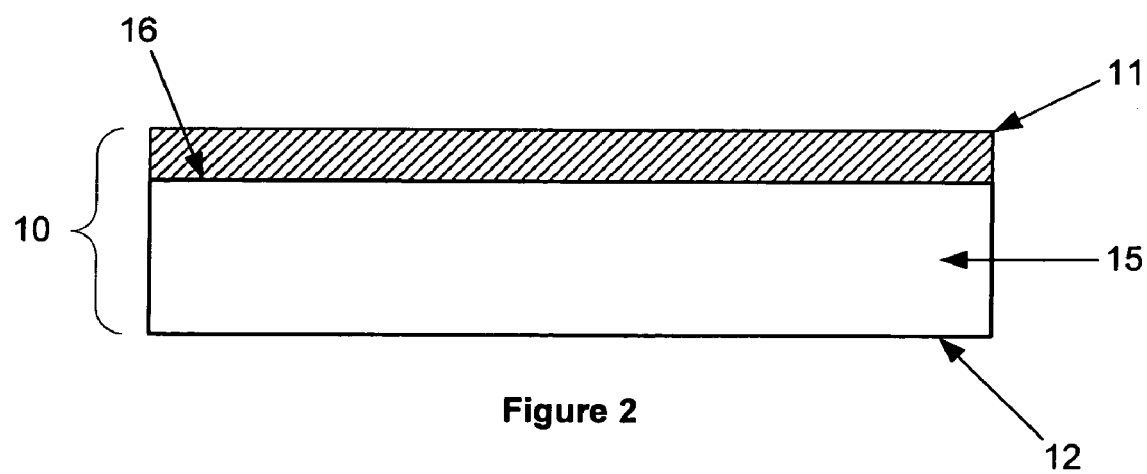
FIG. 2 is a diagrammatic side view of a back-coated wafer, showing the epoxy coating, the wafer backside and the wafer front side, in accordance with an embodiment of the present invention.

FIG. 1 is a diagrammatic top view of a back-coated wafer 10, according to an embodiment of the present invention. Back-coated wafer 10 comprises a semiconductor wafer 15 having an epoxy coating applied to its backside. FIG. 2 is a diagrammatic side view of a back-coated wafer 10, showing the wafer 15, the epoxy coating 11, the wafer backside 16 and the wafer front side 12, according to an embodiment of the present invention. Epoxy coating 11 generally serves as an opaque layer for preventing light from entering the wafer 15 through the wafer backside 16, or as a protective layer for shielding the wafer backside 16. Epoxy coating 11 is generally applied to the wafer backside 16, for example using a screen printing process as described in U.S. Pat. No. 6,023,094 entitled "Semiconductor Wafer Having a Bottom Surface Protective Coating", or by using a mounting tape having a coating layer as described in U.S. patent application Ser. No. 10/830,820 entitled "Semiconductor Devices Having a Back Surface Protective Coating", both of which are incorporated herein by reference.

It is possible for the coating process to result in an unsatisfactory coating, for example due to particular airflow patterns or uneven curing temperatures in a curing oven, resulting in a partially cured or unevenly cured epoxy coating. Even if the produced coating is satisfactory, it is possible that one or more mistakes are made in subsequent laser markings made onto the coating. In such cases, it is desirable to remove the epoxy coating without damaging the wafer backside 16 in order to save the wafer 15 and subsequently rework and/or recoat it.

Figure 3:
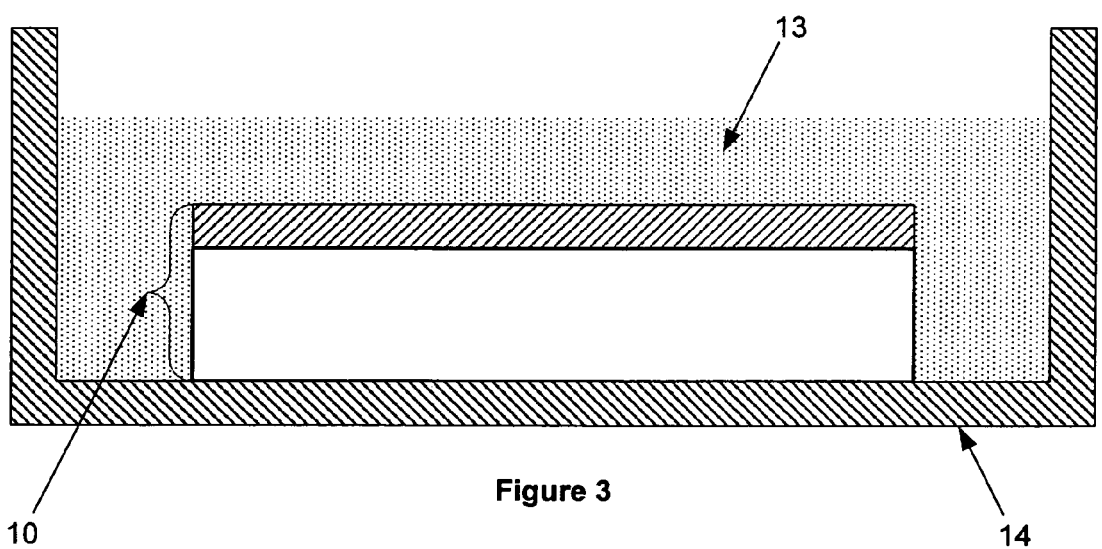
FIG. 3 is a diagrammatic cross-section view of a back-coated wafer soaking in acetone, in accordance with an embodiment of the present invention.

While epoxy remains soft prior to full or partial curing and can be wiped off, wiping is no longer possible once the epoxy is partially or fully cured and hardened. In order to remove the partially or fully cured epoxy coating 11 from the wafer backside 16 without grinding or otherwise damaging or stressing the wafer backside 16, the back-coated wafer 10 is soaked in an acetone bath. FIG. 3 is a diagrammatic cross-section view of a back-coated wafer 10 soaking in a beaker 14 (or other container) filled with acetone 13, in accordance with an embodiment of the present invention. Back-coated wafer 10 is left to soak in acetone 13 for a period of about 1 to 30 minutes in order to allow the adhesion strength of the epoxy coating 11 to degrade. By way of example, a soak time of about 5 minutes has been found to work well.

Figure 4:
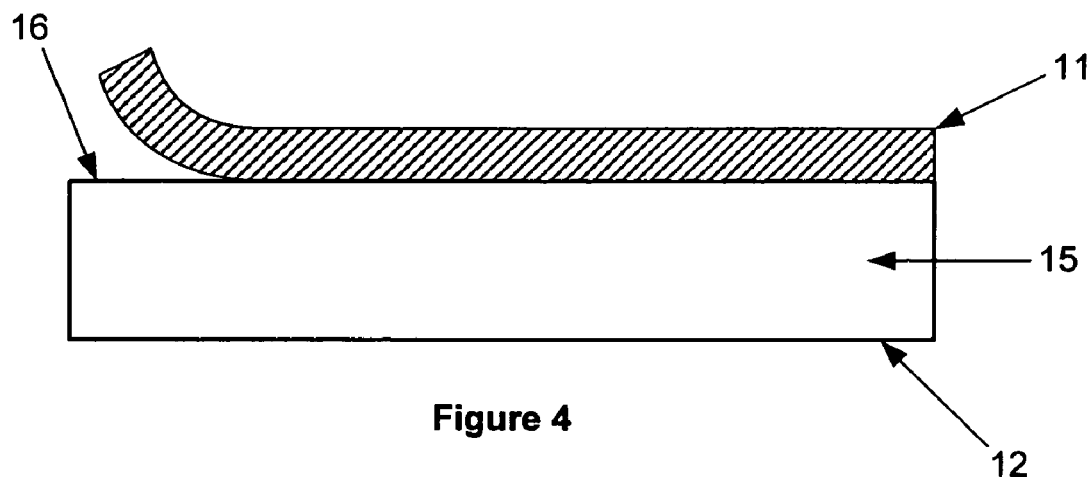
FIG. 4 is a diagrammatic side view of a soaked back-coated wafer showing the epoxy coating as it is peeled away from the wafer backside, in accordance with an embodiment of the present invention.
Figure 5:
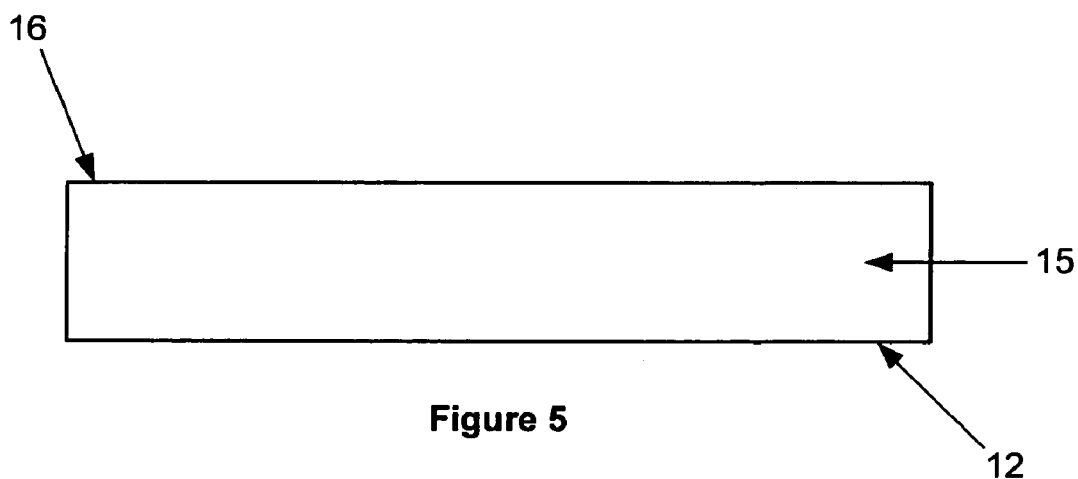
FIG. 5 is a diagrammatic side view of a wafer with the epoxy coating peeled away, in accordance with an embodiment of the present invention.

Following the acetone soak, the epoxy coating 11 is peeled or scraped away from the wafer backside 16, for example either by hand or using a tool such as a razor. FIG. 4 is a diagrammatic side view of the soaked back-coated wafer 10 showing the epoxy coating 11 as it is peeled away from the wafer backside 16, in accordance with an embodiment of the present invention. FIG. 5 is a diagrammatic side view of the wafer 15 with the epoxy coating 11 peeled away, in accordance with an embodiment of the present invention. The wafer backside 16 is shown exposed and ready for a rework or a reapplication of a new epoxy coating.

Figure 6:
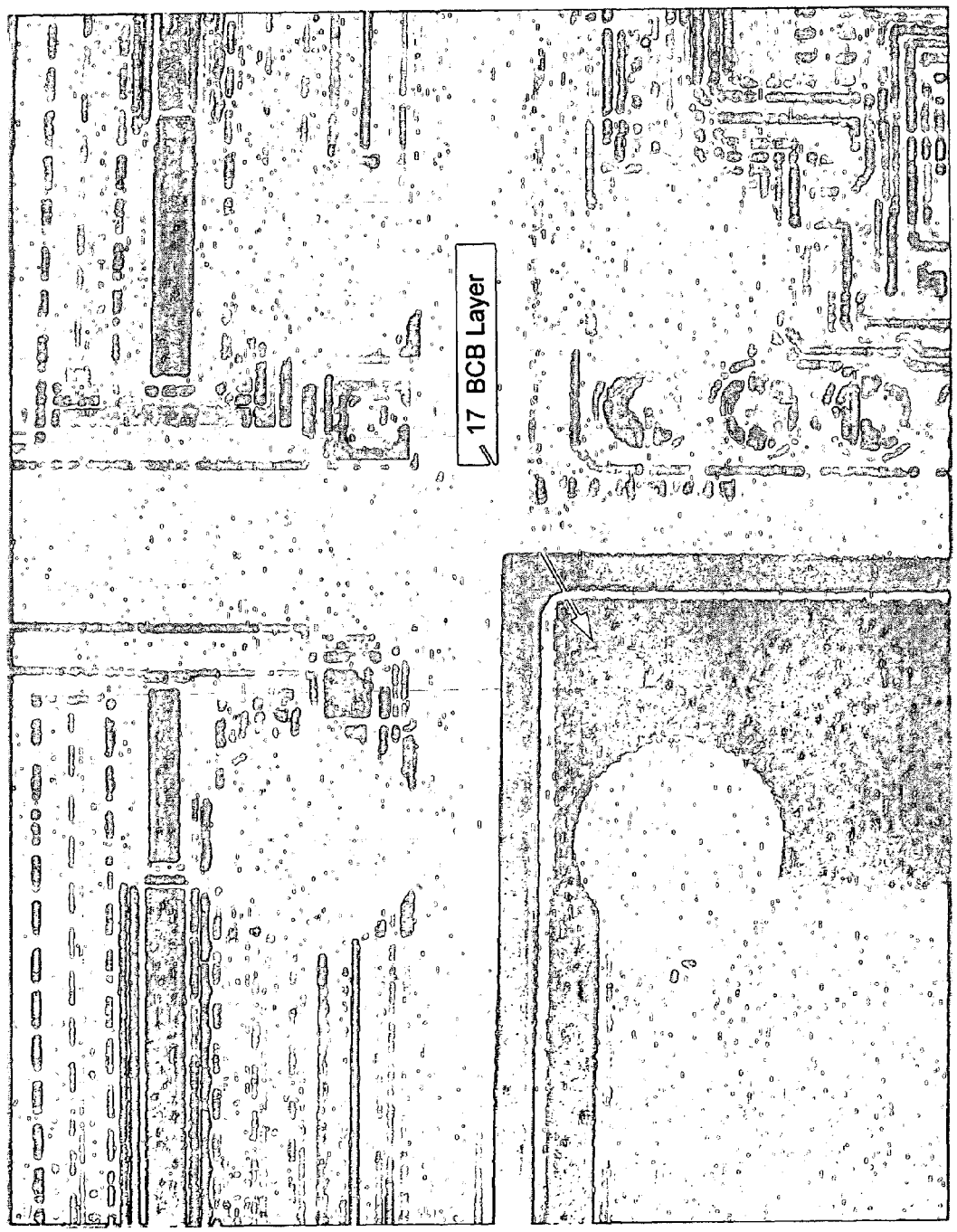
FIG. 6 is a photograph showing a BCB layer on the front side of an example wafer, taken prior to the removal of the epoxy coating using the acetone bath, in accordance with an embodiment of the present invention.
Figure 7:
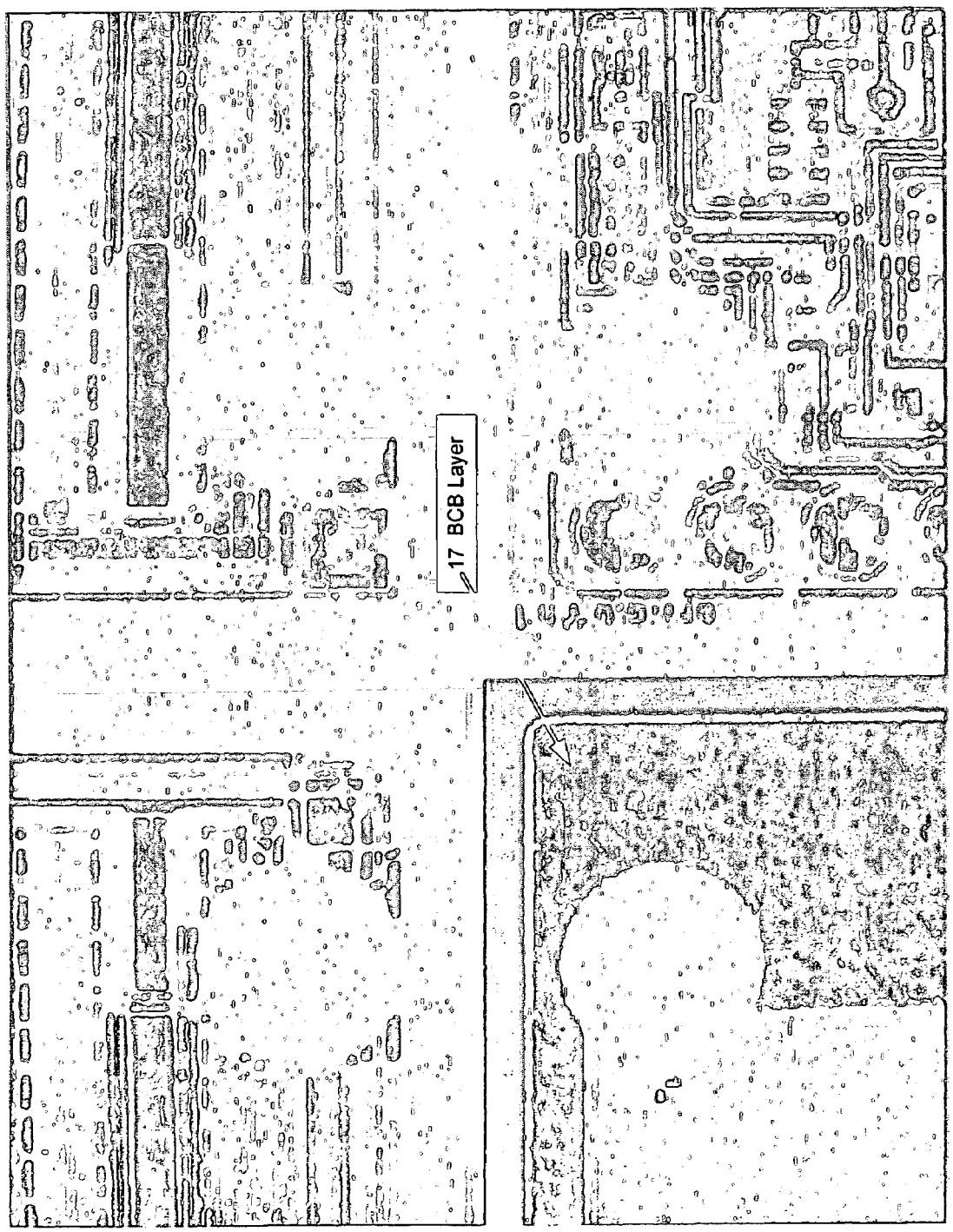
FIG. 7 is a photograph showing the same BCB layer as in FIG. 6, taken after the removal of the epoxy coating and showing no destruction or degradation of the BCB layer, in accordance with an embodiment of the present invention.

As is known to those of ordinary skill in the art, it is common for wafer 15 to comprise a layer of organic material, such as Benzocyclobutene (BCB), exposed on the wafer front surface 12. Accordingly, if the wafer 15 does comprise such a layer, it is desirable that the bath not degrade or damage the organic layer. It is an advantageous aspect of the present invention that acetone 13 does not destroy or degrade such organic layer present on the wafer front side 12. FIG. 6 is a photograph showing such a BCB layer 17 on the front side 12 of an example wafer, with the photograph taken prior to the removal of the epoxy coating 11 using the acetone bath method described above. FIG. 7 is a photograph showing the same BCB layer 17, with the photograph taken after the removal of the epoxy coating 11. As can be seen by a comparison of the photos, there is no destruction or degradation of the BCB layer 17.

Figure 8:
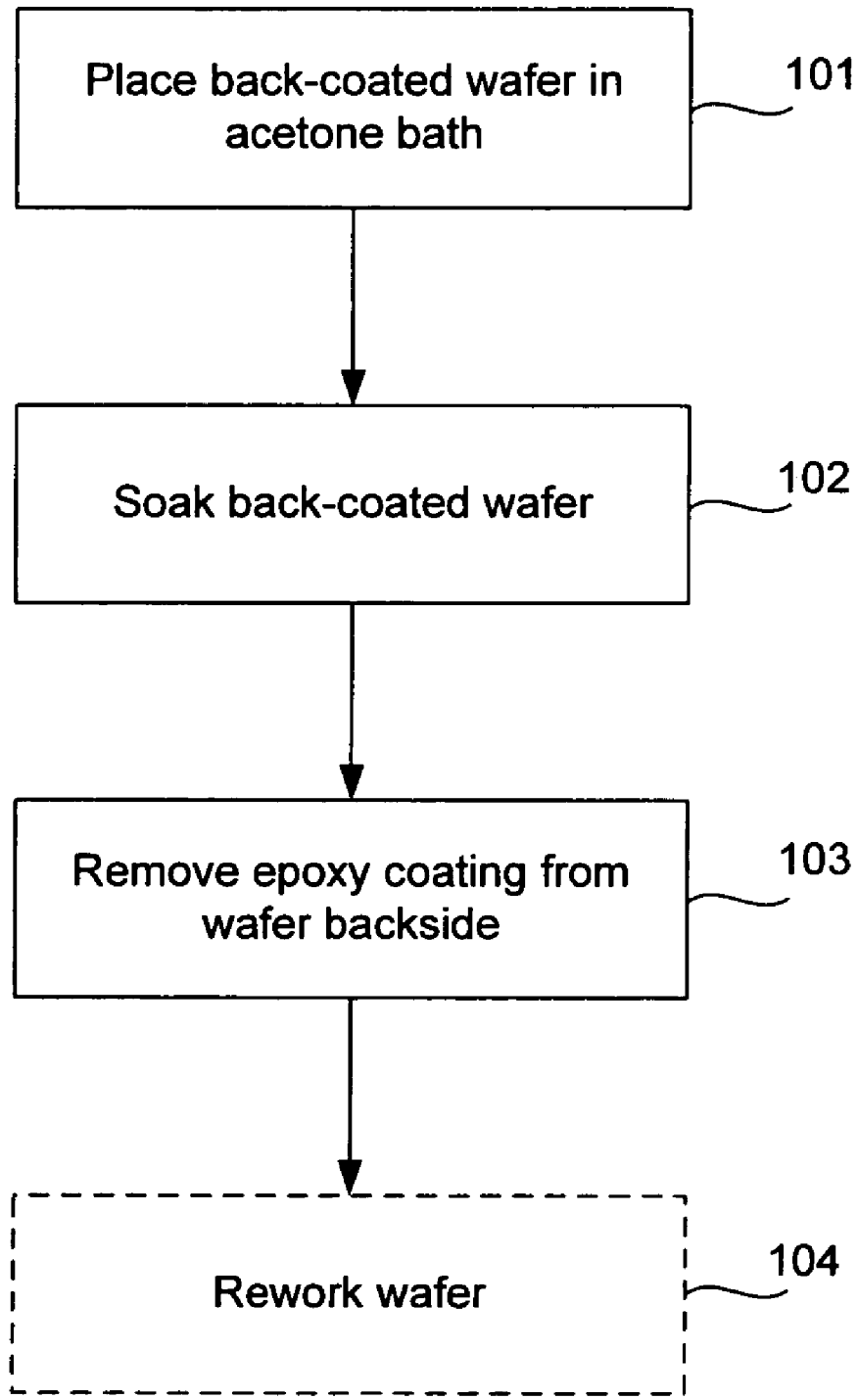
FIG. 8 is a flowchart illustrating the process of soaking a back-coated wafer in acetone in order to non-destructively remove the epoxy coating, in accordance with one embodiment of the present invention.

FIG. 8 is a flowchart illustrating a method for soaking a back-coated wafer in acetone in order to non-destructively remove the epoxy coating, in accordance with one embodiment of the present invention. Place 101 back-coated wafer 10 in acetone bath and let wafer 10 soak 102 for a period of about 1 to 30 minutes (preferably about 5 minutes), during which period the adhesion strength of the epoxy coating 111 will degrade. Following the acetone soak, remove 103 the epoxy coating 11 from the wafer backside 16 by peeling the coating off or by scraping the coating away. The result is a wafer with exposed backside 16, ready for rework 104 or for a reapplication of a new epoxy coating.

In the initially described embodiment acetone was used to remove the epoxy layer. However, it should be appreciated that in alternative embodiments, other acid baths may be used to remove the epoxy. It is important to insure that the acid used to degrade the epoxy must not harm any of the other exposed portions of the wafer. As pointed out above, many wafers use an organic material such as Benzocyclobutene (BCB), as a dielectric layer. Many acid solutions (such as nitric acid and sulfuric acid solutions) tend to attack exposed BCB layers which make them unsuitable for use on wafers that contain BCB. However, it is known that nitric acid and sulfuric acid are generally compatible with conventional semiconductor materials, and therefore, if the wafer does not contain BCB or other vulnerable materials, then nitric acid or sulfuric acid solutions may be suitable for use in removing the epoxy layer. The invention has been described in the context of removing a backside epoxy coating. However, it should be appreciated that the same techniques can be used to remove epoxy layers from other surfaces of the wafer as well. For example, U.S. Pat. No. 6,352,881 and application Ser. Nos. 10/080,913, 10/224, 291, and 10/707,208 each describe the application of coatings (including epoxy based coatings) on the front surface of a wafer. In some implementations, the epoxy based coatings are used to form an underfill layer. In others, an undercoating is provided. It should be appreciated that the described approach can be used to remove underfill coatings and undercoatings from the front side of a wafer as well. In the case that any solder bumps or other surface elements may suffer damage when removing an underfill coating by way of a razor or similar tool, the coating can instead be peeled off, dissolved in the bath, or otherwise removed in a way that does not cause damage to the solder bumps or other surface elements.

Foregoing described embodiments of the invention are provided as illustrations and descriptions. They are not intended to limit the invention to precise form described. Other variations and embodiments are possible in light of above teachings, and it is thus intended that the scope of invention not be limited by this Detailed Description, but rather by claims following.

We claim:

1. A method for non-destructive removal of a cured epoxy based coating in its entirety from a backside surface of a coated semiconductor wafer, the method comprising:
   soaking the coated semiconductor wafer in a liquid, the liquid for degrading an adhesion strength of the cured epoxy based coating; and
   removing the cured epoxy based coating in its entirety from the backside surface of the coated semiconductor wafer;
   thereby leaving the backside surface ready for a rework or for an application of a new curable epoxy based coating.

2. A method as recited in claim 1, wherein the coated semiconductor wafer is soaked for a period in the range of approximately 1 to 30 minutes.

3. A method as recited in claim 1, wherein the semiconductor wafer includes a multiplicity of integrated circuit dice, each die having a plurality of associated contact pads and a plurality of solder bumps, each solder bump being formed on an associated contact pad.

4. A method as recited in claim 1, wherein the coating was applied to the semiconductor wafer using a screen printing process.

5. A method as recited in claim 1, wherein the coating was applied to the semiconductor wafer using a multi-layered wafer mounting tape.

6. A method as recited in claim 1, wherein the curable epoxy comprises a thermosetting plastic.

7. A method as recited in claim 1, wherein the liquid comprises acetone.

8. A method as recited in claim 7, wherein the wafer includes benzocyclobutene exposed on a front surface of the wafer, whereby the acetone does not degrade the exposed benzocyclobutene.

9. A method for non-destructive removal of a cured epoxy based coating in its entirety from a surface of a coated semiconductor wafer, the method comprising:
   soaking the coated semiconductor wafer in a liquid acetone bath, the acetone bath being arranged to degrade an adhesion strength of the coating without degrading or attacking any other portion of the wafer; and removing the coating in its entirety from the surface of the coated semiconductor wafer.

10. A method as recited in claim 9, wherein:

the coated semiconductor wafer includes a multiplicity of integrated circuit dice, each die having a plurality of contact pads and a plurality of solder bumps, each solder bump being secured to an associated contact pad;

the coating is an underfill layer applied to the front side surface of the semiconductor wafer; and the underfill layer is removed from the front side surface of the semiconductor wafer without detaching the solder bumps.

11. A method as recited in claim 9, wherein the coated semiconductor wafer is soaked for a period in the range of approximately 1 to 30 minutes.

12. A method as recited in claim 9, wherein the coated semiconductor wafer includes an organic layer exposed on an active surface of the wafer and wherein the acetone bath is arranged so that it does not degrade the organic layer.

13. A method as recited in claim 12, wherein the organic layer is benzocyclobutene.

14. A method for non-destructive removal of a cured epoxy based coating in its entirety from a backside surface of a coated semiconductor wafer that includes a multiplicity of integrated circuit dice, each die having a plurality of associated contact pads and a plurality of solder bumps, each solder bump being formed on an associated contact pad, and wherein the wafer includes benzocyclobutene exposed on a front surface of the wafer, the method comprising:

soaking the coated semiconductor wafer in a liquid comprising acetone for a period in the range of approximately 1 to 30 minutes, the liquid for degrading an adhesion strength of the cured epoxy based coating; and removing the cured epoxy based coating in its entirety from the backside surface of the coated semiconductor wafer thereby leaving the backside surface ready for a rework or for an application of a new curable epoxy based coating, whereby the acetone does not degrade the exposed benzocyclobutene.

\* \* \* \* \*